United States Patent
Hoofman

(10) Patent No.: US 9,577,322 B2
(45) Date of Patent: Feb. 21, 2017

(54) WIRELESS INTERCONNECT FOR AN INTEGRATED CIRCUIT

(75) Inventor: Romano Hoofman, Geel (BE)

(73) Assignee: NXP B.V., Eindhoven (NL)

( * ) Notice: Subject to any disclaimer, the term of this patent is extended or adjusted under 35 U.S.C. 154(b) by 806 days.

(21) Appl. No.: 13/124,291

(22) PCT Filed: Oct. 20, 2009

(86) PCT No.: PCT/IB2009/054611
§ 371 (c)(1),
(2), (4) Date: Apr. 14, 2011

(87) PCT Pub. No.: WO2010/046845
PCT Pub. Date: Apr. 29, 2010

(65) Prior Publication Data
US 2011/0199275 A1    Aug. 18, 2011

(30) Foreign Application Priority Data
Oct. 21, 2008    (EP) .................................... 08105624

(51) Int. Cl.
| H01Q 21/00 | (2006.01) |
| H01Q 1/40 | (2006.01) |
| H01L 23/66 | (2006.01) |
| H01L 25/065 | (2006.01) |
| H01Q 21/28 | (2006.01) |

(52) U.S. Cl.
CPC .............. *H01Q 1/40* (2013.01); *H01L 23/66* (2013.01); *H01L 25/0657* (2013.01); *H01Q 21/28* (2013.01); *H01L 2223/6677* (2013.01); *H01L 2225/06531* (2013.01); *H01L 2225/06565* (2013.01); *H01L 2924/0002* (2013.01)

(58) Field of Classification Search
USPC ................................... 343/810, 700 MS, 702
See application file for complete search history.

(56) References Cited

U.S. PATENT DOCUMENTS

| 7,760,144 B2 * | 7/2010 | Chang et al. .......... 343/700 MS |
| 7,952,534 B2 * | 5/2011 | Iwata et al. ................... 343/893 |
| 2006/0152911 A1 | 7/2006 | Humbert |
| 2008/0238796 A1 | 10/2008 | Rofougaran |
| 2008/0291092 A1 * | 11/2008 | Matsunaga ............ 343/700 MS |
| 2009/0040119 A1 * | 2/2009 | Kawasaki et al. ............ 343/702 |
| 2010/0090902 A1 * | 4/2010 | Thompson et al. ... 343/700 MS |

FOREIGN PATENT DOCUMENTS

| EP | 1 617 475 A1 | 1/2006 |
| JP | 2001 326328 | 11/2001 |

OTHER PUBLICATIONS

Rashid, A.B.M. Harun-Ur, et al; "Interference Suppression of Wireless Interconnection in Si Integrated Antenna"; Proceedings of the IEEE 2002 Intl. Interconnect Technology Conference; pp. 173-175 (2002).
International Search Report and Written Opinion for Application PCT/IB2009/054611 (Jan. 22, 2010).

* cited by examiner

*Primary Examiner* — Ahshik Kim

(57) ABSTRACT

A wireless interconnect for an integrated circuit and a method of making the wireless interconnect. The interconnect includes a first antenna and a second antenna arranged over a plurality of electrically conductive interconnects. The interconnect also includes a propagation layer. The first and second antennae are arranged in between the propagation layer and the electrically conductive interconnects.

18 Claims, 3 Drawing Sheets

WIRELESS INTERCONNECT FOR AN INTEGRATED CIRCUIT

BACKGROUND OF THE INVENTION

This invention relates to a wireless interconnect for an integrated circuit, and a method for making a wireless interconnect for an integrated circuit.

Known integrated circuits (ICs) include a wireless interconnect having first and second antennae, between which electromagnetic (typically RF) radiation carrying a signal can be propagated. Typically, an IC having such a wireless interconnect may also include wired interconnects comprising a plurality of electrically conductive signal lines. An example of such an arrangement is shown in FIG. 1.

In FIG. 1, a first antenna 2 and a second antenna 4 are arranged over a plurality of electrically conductive (wired) interconnects indicated generally at 12. The first antenna 2 and a second antenna 4 and the electrically conductive interconnects 12 are provided in a region 6. The region 6 is provided on a substrate 8.

The arrangement shown in FIG. 1 suffers from the problem of interference in the signals passed between the first 2 and second 4 antennae, caused by the presence of the electrically conductive interconnects 12. This interference can lead to signal distortion and a loss of transmission gain.

Propagation of electromagnetic radiation between the first 2 and second 4 antennae in arrangements of the kind shown in FIG. 1 occurs primarily within the substrate 8. As can be seen from FIG. 1, radiation propagating between the first 2 and second 4 antennae via the substrate 8 must traverse the region containing the electrically conductive interconnects 12, whereby the electrically conductive nature of the interconnects 12 can lead to the aforementioned interference.

It may be possible to avoid overlap of the antennae 2, 4 with areas in the IC 10 containing electrically conductive interconnects 12. This could, for example, be achieved by placing the antennae 2, 4 and the wired interconnects in completely separate areas of the IC, or by leaving openings in the network of interconnects 12 (beneath the antennae 2, 4) to allow the free passage of electromagnetic radiation. Neither approach is desirable however, since they would both increase the complexity of the IC design and would create exclusion areas for the electrically conductive interconnects 12 leading to a loss of effective chip area.

A paper by Rashid et al. entitled "Interference suppression of wireless interconnection in Si integrated antenna", Interconnect Technology Conference, 2002, Proceedings of the IEEE 2002 International, pages 173-175, describes 3-D finite element simulations of Si integrated antennae. The simulations described in this paper indicate that a rapid decrease in antenna transmission gain occurs when the number of signal carrying metal lines between the transmitter and the receiver is increased. The authors of this paper suggest placing a high resistivity Si or high permittivity interlayer dielectric material below the antenna, with the signal lines below the interlayer.

Embodiments of this invention can address at least some of the problems indicated above.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

According to an aspect of the invention, there is provided a wireless interconnect according to claim 1. According to another aspect of the invention, there is provided a method of making a wireless interconnect according to claim 10.

In accordance with embodiments of this invention, since the first and second antennae are arranged in between the propagation layer and the electrically conductive interconnects, RF radiation passing between the first and second antennae can propagate via the propagation layer without having to traverse the electrically conductive interconnects.

The propagation layer can include a semiconductor material, for example silicon. In particular, the propagation layer may comprise a semiconductor substrate of a die or wafer. The substrate forming the propagation layer may be included in the same wafer or die as the electrically conductive interconnects and the first and second antennae. Alternatively, the electrically conductive interconnects and the first and second antennae can be provided in a first wafer or die, and the propagation layer can comprise a semiconductor substrate of a second wafer or die. Accordingly, embodiments of the invention can involve the stacking of wafers and/or dies to arrange propagation layers comprising the semiconductor substrates of wafers and/or dies over the antennae.

The first and second antennae and the electrically conductive interconnects can be arranged within a common layer of material. The electrically conductive interconnects can be arranged in a plurality of levels. The electrically conductive interconnects and/or first and second antennae can be formed using, for example, aluminium or damascene processing. The first and second antennae can be provided in a passivation layer over the electrically conductive interconnects.

The first and second antennae can, for example, be dipole antennae.

According to a further aspect of the invention, there is provided an integrated circuit comprising a wireless interconnect of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention allow RF radiation passing between two antennae in an integrated circuit to propagate via a propagation layer. The propagation layer, which does not include electrically conductive interconnects that would substantially affect the signal, is provided on a first side of the first and second antennae, while a plurality of interconnects are provided on a second side of the antennae. Thus, the first and second antennae are arranged in between the propagation layer and the electrically conductive interconnects. This arrangement allows RF radiation passing between the first and second antennae to propagate without having to traverse the electrically conductive interconnects. Interference of the signal passing between the antennae is thereby reduced.

Figure 1:
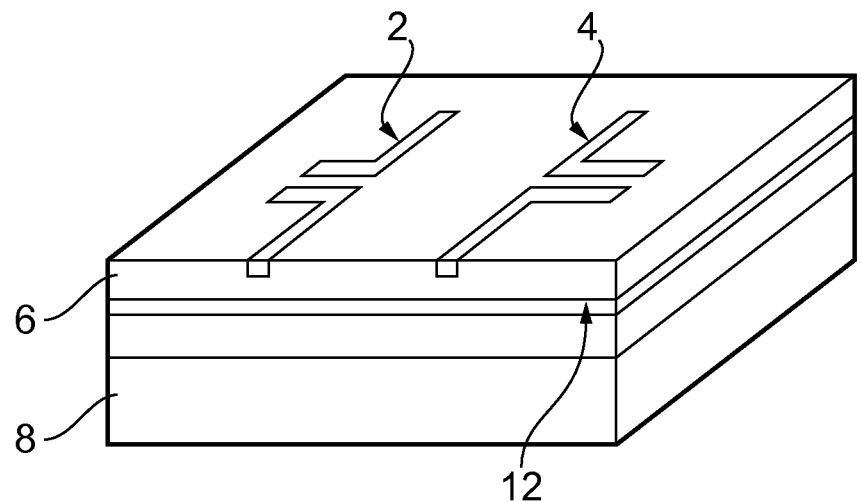
FIG. 1 shows a known wireless interconnect.
Figure 2:
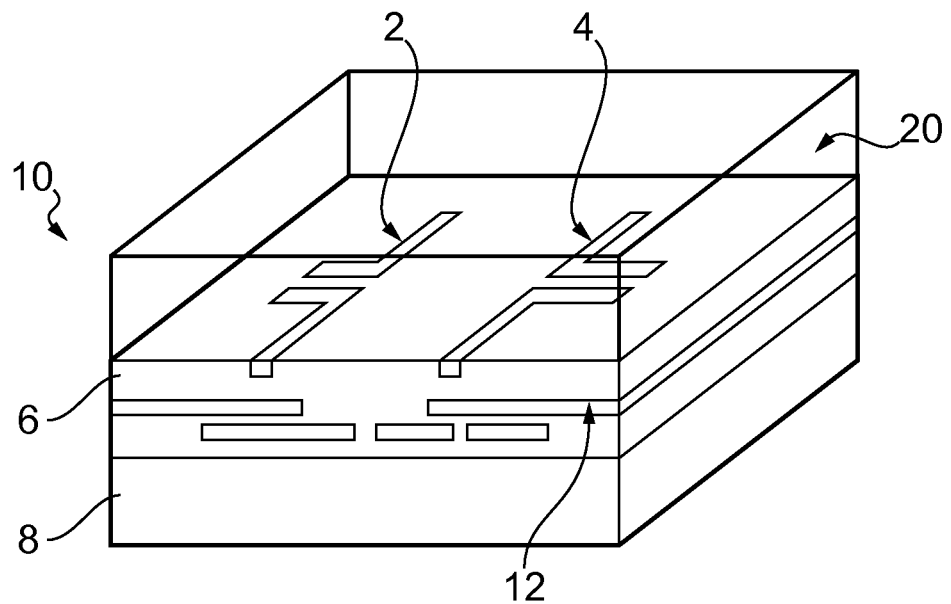
FIG. 2 shows an example of a wireless interconnect in accordance with an embodiment of the invention.

A first example of this arrangement is shown in FIG. 2.

The integrated circuit (hereinafter IC) 10 shown in FIG. 2 includes a substrate 8 on which there is provided a region 6, typically a layer of semiconductor material. Within the region 6 there are provided a plurality of electrical interconnects 12, which form electrical interconnects of the IC 10. Also in the region 6, above the electrical interconnects 12, there are provided a first and a second antenna 2, 4. The antennae 2, 4 may, for example, comprise dipole antennae. In accordance with an embodiment of the invention, the first and second antennae 2, 4 as well the electrical interconnects 12 may be formed on the substrate using, for example, conventional aluminium or damascene processing, although any other suitable process could also be used. The electrical interconnects 12 may be provided on a plurality of metal levels. In one embodiment, the antennae 2, 4 may be formed using the same process as that used to produce the electrical interconnects. The antennae 2, 4 may thus be formed as a further metal level provided over a plurality of metal levels forming the electrical interconnects 12.

The IC 10 shown in FIG. 2 also includes a propagation layer 20. In this example, the propagation layer 20 is provided above the region 6, opposite the electrical interconnects 12. As described above, the positioning of the propagation layer 20 is such that signals passing between the antennae 2, 4 can propagate without having to traverse the electrical interconnects 12. The propagation layer 20 can comprise any material through which a signal passing between the antennae 2, 4 can easily propagate. The propagation layer 20 may, for example, comprise a layer of semiconductor material, such as a layer of silicon.

The propagation layer shown in FIG. 2 may be grown (e.g. by an epitaxial process) or deposited over the region 6 following the formation of the electrical interconnects 12 and antennae 2, 4. Another possibility for providing a propagation layer is described below in relation to FIGS. 3 to 5.

Figure 3:
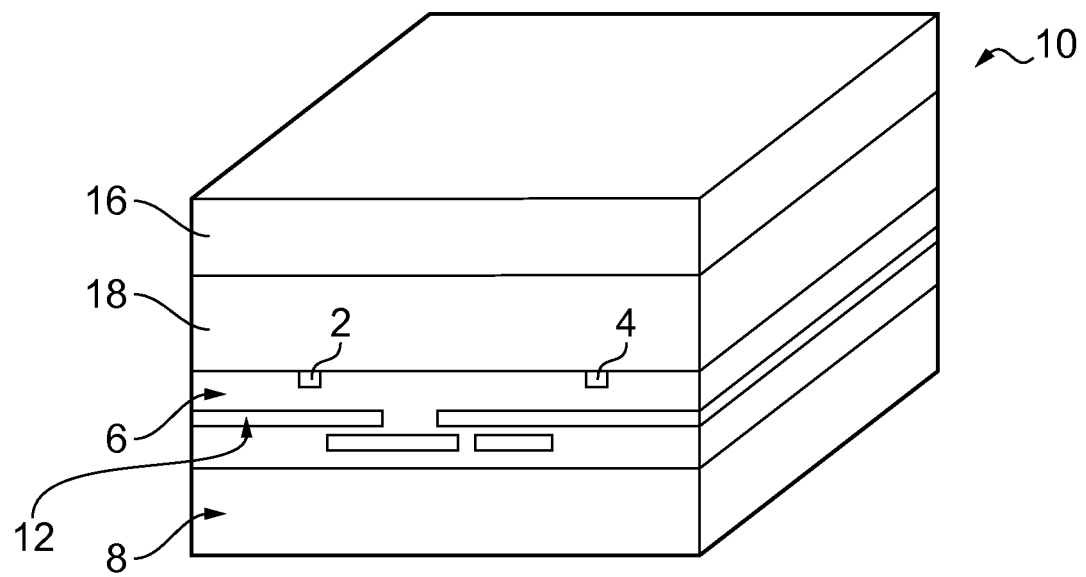
FIG. 3 shows another example of a wireless interconnect in accordance with an embodiment of the invention.

In common with the arrangement of FIG. 2, the embodiment shown in FIG. 3 includes a substrate 8 on which there is provided a region 6 having a plurality of electrical interconnects 12, and first and second antennae 2, 4. In the embodiment of FIG. 3, the IC comprises a first die (including the substrate 8 and region 6), upon which there is positioned second die (including a semiconductor substrate 18), in a stacked arrangement. The second die may include one or more layers 16 provided on the substrate 18.

In this example, it is the substrate 18 of the second die that provides the propagation layer for the antennae 2, 4 of the first die. The substrate 18 may, for example, comprise a semiconductor (typically Si) substrate, whereby the propagation layer in this example would constitute a semiconductor layer of the kind described above in relation to FIG. 2.

Figure 4:
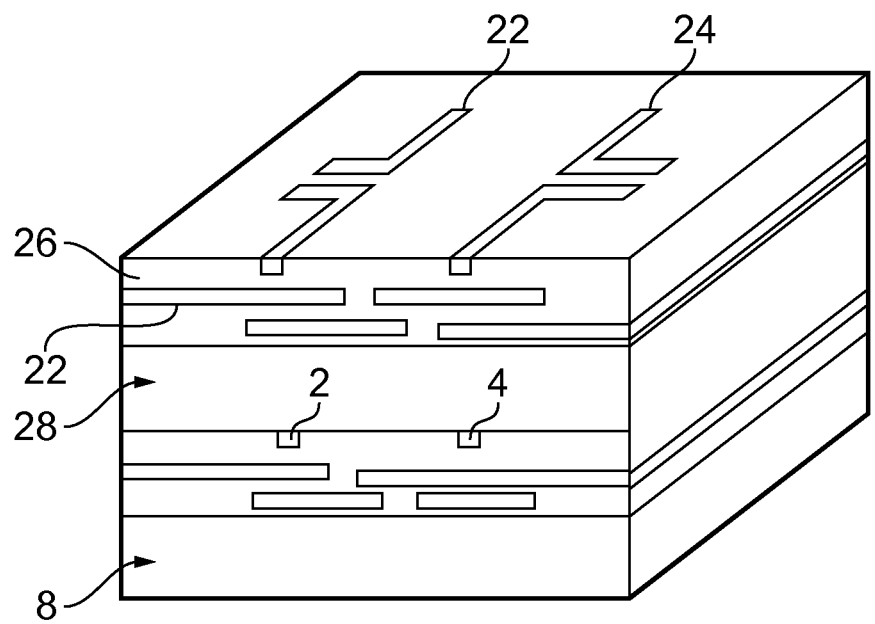
FIG. 4 shows an example of a stack comprising a plurality of wireless interconnects in accordance with an embodiment of the invention.

FIG. 4 illustrates a further example in which two substantially identical dies are stacked in a similar fashion to that described above in relation to FIG. 3. As before, the example in FIG. 4 includes a first die having a substrate 8, with a region thereon including electrical interconnects 12 and antennae 2, 4. In this example, the second die also includes a substrate 28 and a region 26 having electrical interconnects 22 and antennae 22, 24. The second die is therefore of similar if not identical construction to the first die. In this way, multiple similar or identical dies can be produced and then stacked together to produce wireless interconnect arrangements in accordance with the present invention.

Figure 5:
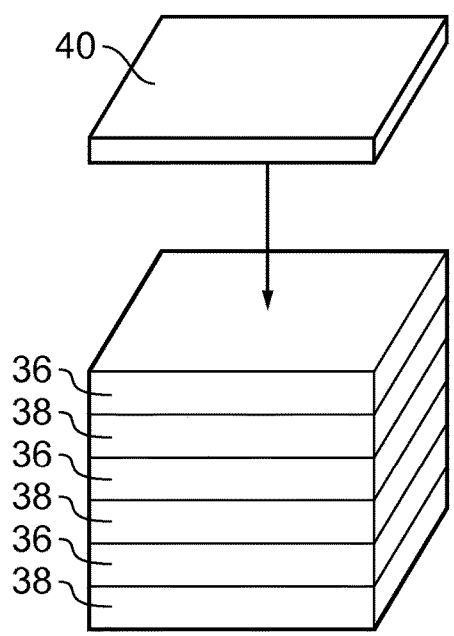
FIG. 5 schematically shows a stack of wafers/dies incorporating wireless interconnects in accordance with an embodiment of the invention.

As shown in FIG. 5, the stack described above in relation to FIG. 4 need not be limited to only two dies. Any suitable number of dies may be stacked together to form a there dimensional IC, with the substrates of at least some of the dies providing propagation layers for the dies below them in the stack. Different dies in the stack may in some embodiments provide different functions of the IC. For example, a first die in the stack may provide I/O, A/D functionality, while a second die may provide memory (storage) functions. A further die may provide processor logic functionality. It is noted that the accompanying drawings are schematic in the sense that they are not drawn to scale and show only the parts of each die that include the antennae. The antennae may typically form only a small part of a given die. Moreover, it is envisaged that the propagation layer need only be provided above that part of the die that incorporates the antennae. It is further envisaged that more than one pair of antennae can be provided in a given die. Each set of antennae may be provided with its own local propagation layer. Alternatively, multiple pairs of antennae may share a common propagation layer.

A stack of the kind described herein can be built in a number of different ways. In one example, multiple dies may be stacked together using die-to-die bonding. In another example, multiple wafers can be stacked (using wafer-to-wafer bonding) and then cut to form an arrangement of the kind shown in FIG. 5. In a hybrid example, die-to-wafer bonding can be used.

Figure 6A:
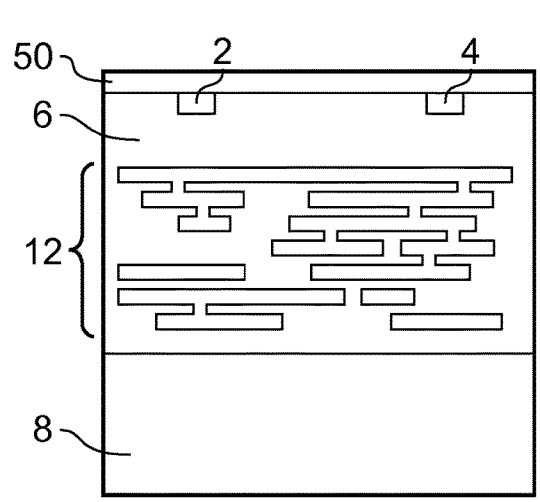
FIGS. 6A and 6B show examples of wireless interconnects in accordance with an embodiment of the invention.
Figure 6B:
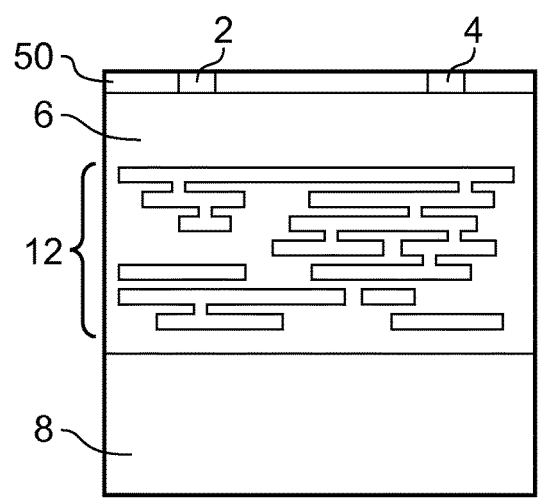

FIGS. 6A and 6B show in more detail a die of the kind described above. In particular, FIGS. 6A and 6B illustrate the multi-level nature of the electrical interconnects according to some embodiments. Suitable processes for manufacturing the multiple metal levels are well known in the art, and will not be described herein.

FIG. 6A shows that the antennae 2, 4 may be provided as a top metal level during a (e.g. copper) damascene process in which the electrical interconnects 2 are also formed. A passivation layer 50 can be provided over the metal levels incorporating the antennae and electrical interconnects. In an alternative example (shown in FIG. 6B), the antennae 2, 4 can be provided within the passivation layer 50. In this example, the antennae 2, 4 can comprise aluminium.

Accordingly, there has been described a wireless interconnect for an integrated circuit and a method of making the wireless interconnect. The interconnect includes a first antenna and a second antenna arranged over a plurality of electrically conductive interconnects. The interconnect also includes a propagation layer. The first and second antennae are arranged in between the propagation layer and the electrically conductive interconnects.

Although particular embodiments of the invention have been described, it will be appreciated that many modifications/additions and/or substitutions may be made within the scope of the claimed invention.

The invention claimed is:

1. A wireless interconnect for an integrated circuit, the wireless interconnect comprising:
   a first antenna and a second antenna arranged over a plurality of electrically conductive interconnects; and a propagation layer configured to allow signals to propagate between the first antenna and the second antenna, wherein the first and second antennae are arranged in between the propagation layer and the electrically conductive interconnects, the electrically conductive interconnects and the first and second antennae are provided on a first wafer or die, and the electrically conductive interconnects are arranged in between the first and second antennae and a semiconductor substrate of the first wafer or die.

2. The wireless interconnect of claim 1, wherein the propagation layer comprises a semiconductor material.

3. The wireless interconnect of claim 2, wherein the propagation layer comprises a semiconductor substrate of a die or wafer.

4. The wireless interconnect of claim 3, wherein the propagation layer comprises a semiconductor substrate of a second wafer or die.

5. The wireless interconnect of claim 1, wherein the first and second antennae and the electrically conductive interconnects are arranged within a common layer of material.

6. The wireless interconnect of claim 1, wherein the first and second antennae are dipole antennae.

7. The wireless interconnect of claim 1, wherein the electrically conductive interconnects are arranged in a plurality of levels.

8. An integrated circuit comprising the wireless interconnect of claim 1.

9. A method of making a wireless interconnect for an integrated circuit, the method comprising:
arranging a first antenna and a second antenna over a plurality of electrically conductive interconnects; and
providing a propagation layer over the first and second antennae, such that the first and second antennae are arranged in between the propagation layer and the electrically conductive interconnects;
arranging the electrically conductive interconnects over a semiconductor substrate of the first wafer or die, and
arranging the first and second antennae over the electrically conductive interconnects opposite the semiconductor substrate of the first wafer or die.

10. The method of claim 9, wherein the propagation layer comprises a semiconductor material.

11. The method of claim 10, wherein the propagation layer comprises a semiconductor substrate of a die or wafer.

12. The method of claim 11, further comprising:
stacking a second wafer or die over the first wafer or die to arrange a semiconductor substrate of the second wafer or die over the first and second antennae.

13. The method of claim 9, comprising:
forming the plurality of electrically conductive interconnects and the first and second antennae using aluminum or damascene processing.

14. The method of claim 9 comprising:
arranging the first and second antennae and the electrically conductive interconnects within a common layer of material.

15. The method of claim 9, comprising:
forming the plurality of electrically conductive interconnects using a damascene process, and providing the first and second antennae in a passivation layer over the electrically conductive interconnects.

16. The method of claim 9, comprising:
arranging the electrically conductive interconnects in a plurality of levels.

17. The method of claim 10, further comprising:
incorporating the wireless interconnect into an integrated circuit.

18. The method of claim 11, wherein the propagation layer is only provided above a portion of the die that incorporates the antennae.

* * * * *